US008847370B2

(12) United States Patent
Lee et al.

(10) Patent No.: US 8,847,370 B2
(45) Date of Patent: Sep. 30, 2014

(54) EXPOSED DIE PACKAGE THAT HELPS PROTECT THE EXPOSED DIE FROM DAMAGE

(75) Inventors: Lee Han Meng Eugene Lee, Muar (MY); Kok Leong Yeo, Melaka (MY); Kooi Choon Ooi, Melaka (MY); Chen Seong Chua, Melaka (MY)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 13/270,134

(22) Filed: Oct. 10, 2011

(65) Prior Publication Data
US 2013/0087901 A1 Apr. 11, 2013

(51) Int. Cl.
H01L 23/495 (2006.01)
B29C 45/14 (2006.01)
H01L 23/31 (2006.01)
H01L 21/78 (2006.01)
H01L 23/00 (2006.01)
H01L 21/56 (2006.01)

(52) U.S. Cl.
CPC ........... *B29C 45/14* (2013.01); *B29C 45/14655* (2013.01); *H01L 2924/18161* (2013.01); *H01L 23/4951* (2013.01); *H01L 2224/16245* (2013.01); *H01L 23/49572* (2013.01); *H01L 23/3107* (2013.01); *H01L 23/495* (2013.01); *H01L 21/78* (2013.01); *H01L 24/97* (2013.01); *H01L 21/56* (2013.01); *H01L 2924/01029* (2013.01); *H01L 21/565* (2013.01); *H01L 2224/97* (2013.01); *H01L 2924/1815* (2013.01)

USPC ........................................................ 257/676

(58) Field of Classification Search
CPC ................. H01L 2924/00; H01L 2224/48247; H01L 2224/48091; H01L 2924/00014; H01L 2224/48465; H01L 2224/73265
USPC .............. 257/676; 438/127, 123; 264/272.17; 425/116
See application file for complete search history.

(56) References Cited

U.S. PATENT DOCUMENTS

| 5,604,376 | A | * | 2/1997 | Hamburgen et al. | ......... 257/676 |
| 6,072,239 | A | * | 6/2000 | Yoneda et al. | ................. 257/730 |
| 2002/0190366 | A1 | * | 12/2002 | Hung et al. | ................... 257/684 |
| 2007/0099343 | A1 | * | 5/2007 | Pavier | ........................... 438/106 |
| 2009/0280603 | A1 | * | 11/2009 | Qiao et al. | ..................... 438/124 |
| 2010/0193922 | A1 | * | 8/2010 | Kastner et al. | ................. 257/676 |

* cited by examiner

Primary Examiner — Duy T Nguyen
(74) Attorney, Agent, or Firm — Eugene C. Conser; Frederick J. Telecky, Jr.

(57) ABSTRACT

In one aspect of the present invention, an integrated circuit package with an exposed die and a protective housing will be described. The housing extends beyond the exposed back surface of the die to help protect it from damage. The integrated circuit package includes a lead frame and an integrated circuit die. The integrated circuit die is electrically and physically attached to the lead frame. The housing encapsulates the lead frame and the die. The housing also includes a recessed region at the bottom of the package where the back surface of the die is exposed. There is a protruding protective structure at the bottom of the package that helps to protect the die and prevent its exposed back surface from coming in contact with an external object.

6 Claims, 5 Drawing Sheets

EXPOSED DIE PACKAGE THAT HELPS PROTECT THE EXPOSED DIE FROM DAMAGE

FIELD OF THE INVENTION

The present invention relates to integrated circuit packaging. More specifically, the present invention relates to a design for an exposed die package that helps protect the exposed die from damage.

BACKGROUND OF THE INVENTION

There are a number of conventional processes for packaging integrated circuit (IC) dice. By way of example, many IC packages utilize a metallic lead frame. The die may be electrically connected to the lead frame by means of bonding wires or solder bumps that have been preformed on the active surface of the die. In general, the die and portions of the lead frame are encapsulated with a molding compound to protect the delicate electrical components on the active side of the die. In some applications, it is desirable to leave the back surface (opposite the active surface) of the die exposed; that is, not to encapsulate the back surface of the die with molding compound. By way of example, it may be desirable to leave the back surface of the die exposed in order to increase heat transfer out of the die. This is especially relevant for packages used in power applications. In such exposed die packages, the back surface of the die may be pre-coated with a thin metallic layer. In some applications, the metallic layer may be soldered directly to a printed circuit board (PCB) in order to further enhance the heat transfer out of the die.

While existing arrangements and methods for packaging integrated circuits work well, there are continuing efforts to develop improved packaging techniques that provide cost effective approaches for meeting the needs of a variety of different packaging applications.

SUMMARY OF THE INVENTION

In one aspect of the present invention, an integrated circuit package with an exposed die and a protective housing will be described. The housing extends beyond the exposed back surface of the die to help protect it from damage. The integrated circuit package includes a lead frame and an integrated circuit die. The integrated circuit die is electrically and physically attached to the lead frame. The housing encapsulates the lead frame and the die. The housing also includes a recessed region at the bottom of the package where the back surface of the die is exposed. A protruding protective structure, which defines the recessed region, helps to prevent the exposed back surface of the die from coming in contact with an external object.

The protruding protective structure can take a variety of different forms, depending on the needs of a particular application. By way of example, the protruding structure can take the form of legs, spacers and/or can be a wall that entirely surrounds the back surface of the die. In various embodiments, the protective structure is arranged to protrude from the bottom of the package such that if the bottom of the package were placed on a flat surface, the weight of the package would be carried by the protective structure and the flat surface would not come in contact with the back surface of the die.

In another aspect of the present invention, a method for forming the aforementioned integrated circuit package is described. Various embodiments of the present invention involve a molding apparatus with an adjustable support platform that is arranged to form the housing and protective structures of the integrated circuit package.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to the packaging of integrated circuits. More specifically, various embodiments of the present invention involve a housing on an exposed die package that is designed to protect the exposed die from damage, scratches or abrasion.

As previously discussed, an exposed die package offers various advantages, such as improved heat dissipation. However, since a portion of an integrated die is exposed, it may be more vulnerable to abrasion and scratching during assembly and testing. By way of example, during the molding and laser marking operations, lead frames with encapsulated dice may be stacked over one another. During the stacking of the lead frames, an exposed die may come in contact with other lead frames or with the processing equipment. This contact can form scratches on the exposed surface of the die. If the damage is severe enough, it may affect the thermal or electrical performance of the integrated circuit.

Figure 1A:
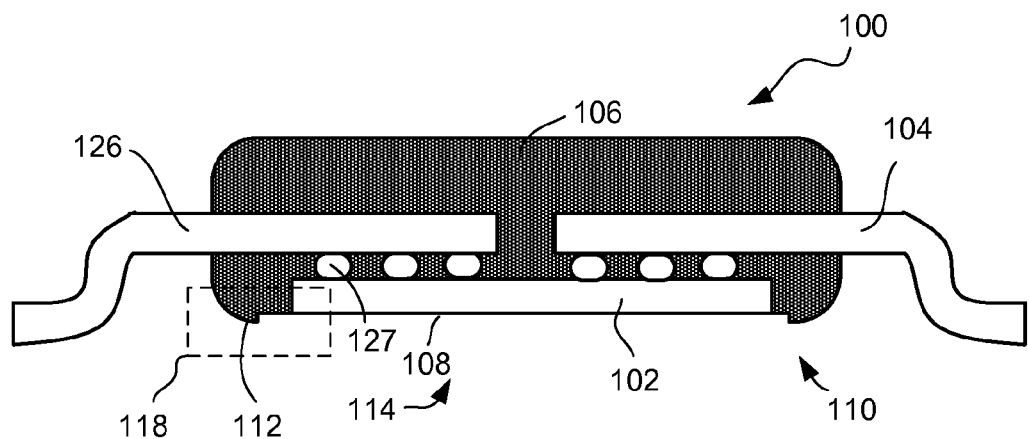
FIG. 1A is a diagrammatic cross-sectional view of an integrated circuit package with an exposed die and a protruding protective structure according to a particular embodiment of the present invention.

Various embodiments of the present invention are designed to address this problem. Referring initially to FIG. 1A, an integrated circuit package 100 according to a particular embodiment of the present invention will be described. The package 100 includes an integrated circuit die 102 that is connected to a lead frame 104. The die 102 is encapsulated in molding material 106 such that the back surface 108 of the die 102 is exposed. The molding material 106 forms a protective housing 110 around the integrated circuit. The housing 110 further includes protruding protective structures 112 that extend beyond the back surface 108 of the die 102 to help prevent the die from coming in contact with an external object or surface.

The exposed back surface 108 of the die 102 and the protruding protective structures 112 are situated at a bottom 114 of the integrated circuit package 100. There is a recessed region 116 at the bottom 114 of the package 100, which is where the exposed back surface 108 of the die 102 is situated and protected. The protruding protective structures 112 are arranged around the periphery of the recessed region 116 at the bottom of the package. The protective structures 112 act like spacers or feet that help maintain a distance between the exposed die surface and the surface of some other object, such as another lead frame or processing equipment. That is, if the bottom 114 of the integrated circuit package 100 (not including the leads 126) were placed on a flat surface, the weight of the integrated circuit package 100 would fall entirely or mostly on the protruding protective structures 112 and there would be a gap between the back surface of the die 102 and the flat surface.

Figure 1B:
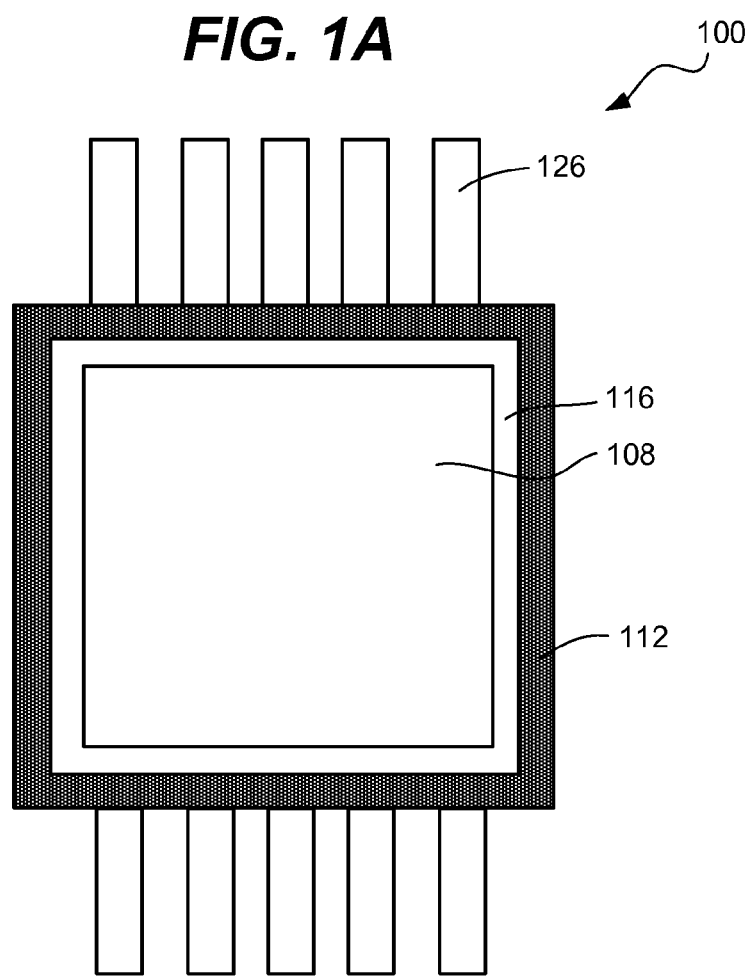
FIG. 1B is a diagrammatic bottom view of the integrated circuit package illustrated in FIG. 1A.

Referring next to FIG. 1B, a diagrammatic bottom view of the integrated circuit package 100 illustrated in FIG. 1A will be described. The exposed back surface 108 of the die 102 is set within a recessed region 116. A protruding protective structure 112 is arranged around the recessed region 116. This structure can take various forms. In the illustrated embodiment, for example, the protective structure 112 is a wall that forms a continuous, closed, rectangular shape around the recessed region 116. In other embodiments, the protective structure 112 may not be continuous, may have breaks in it, may be formed from individual pedestals, etc. Generally, the protective structure 112 may be any suitable structure that is arranged to help prevent the back surface 108 of the die 102 from coming in direct contact with an object that is positioned adjacent to the bottom 114 of the integrated circuit package 100.

Figure 1C:
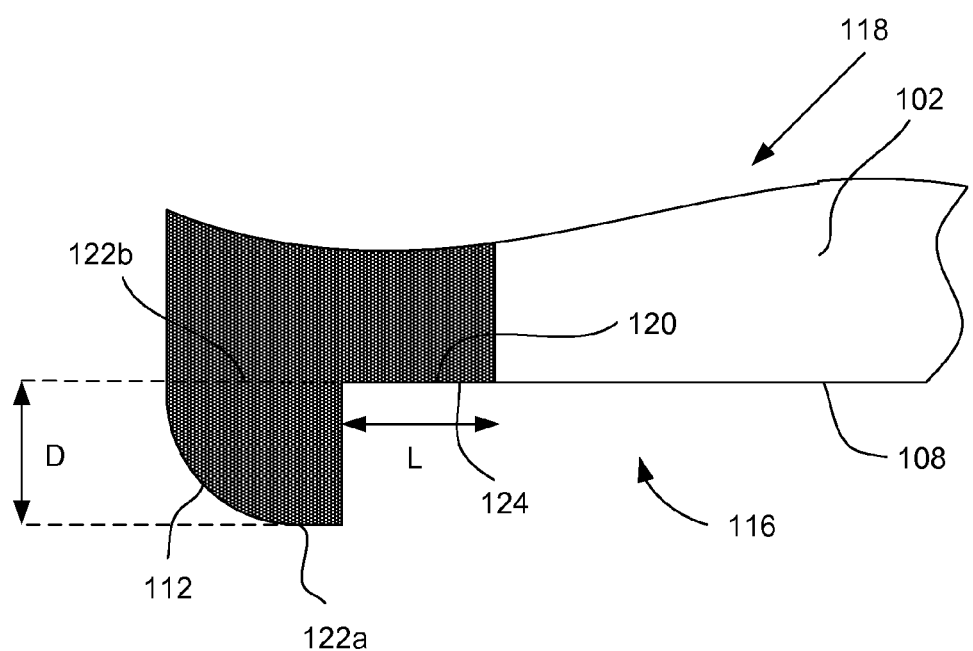
FIG. 1C is an enlarged view of a portion of the integrated circuit package illustrated in FIG. 1A.
Figure 2:
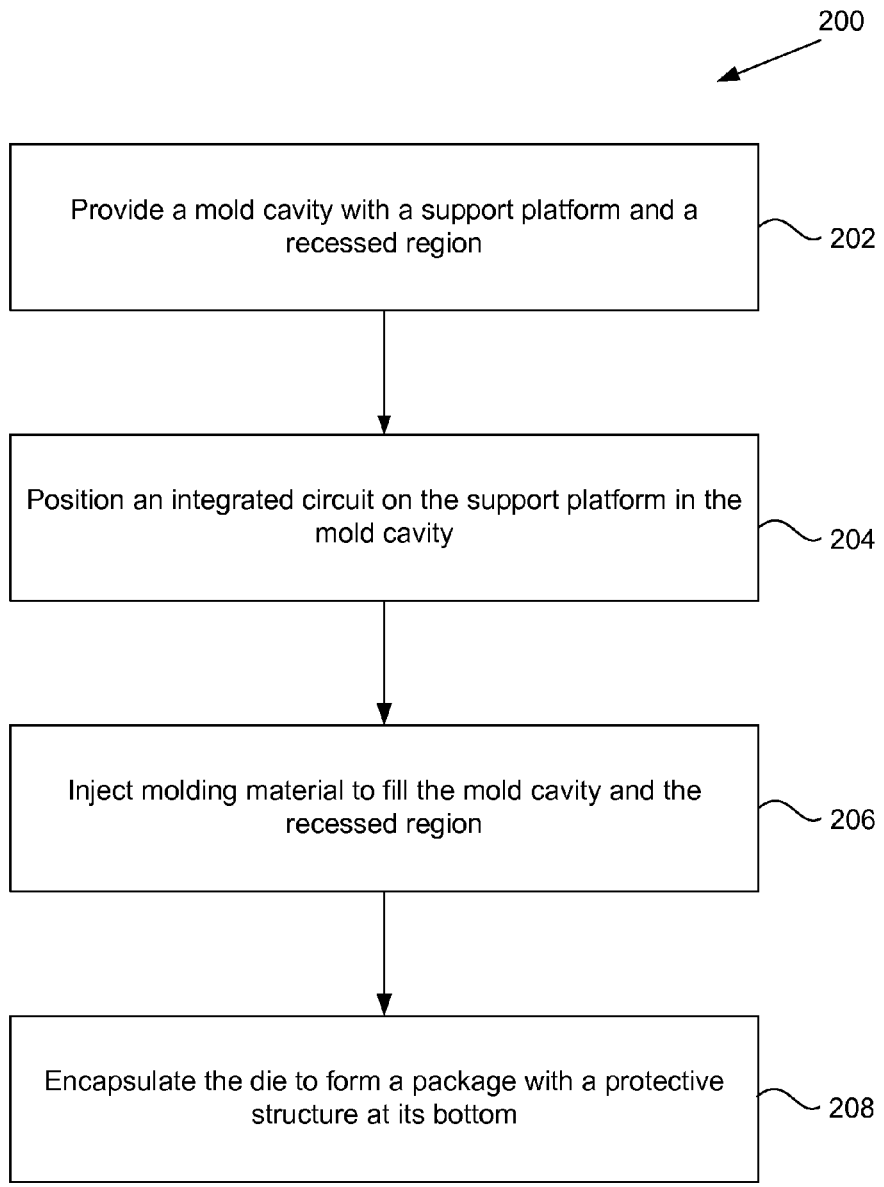
FIG. 2 is a flow chart illustrating a method for forming the integrated circuit package illustrated in FIG. 1A.

Referring now to FIG. 1C, an enlarged diagrammatic cross-sectional view of a bottom region 118 of the integrated circuit package 100 illustrated in FIGS. 1A and 1B will be described. Preferably, there is a substantial buffer region along the bottom surface of the recessed region 116 between the edge of the back surface of the die and the bottom end of the protective structure. By way of example, this buffer region or distance may have a length L of approximately at least 2 mils. The buffer region provides additional space for processing equipment to accurately place the integrated circuit die within the recessed region. If the buffer region is too small and overly close to the margin of error of the processing equipment, the equipment may be unable to arrange the recessed region and the die properly.

The dimensions of the recessed region 116 may be arranged in various ways, depending on the needs of a particular application. The height of the protruding protective structure 112 defines the depth D of the recessed region 116. Generally, a balance is sought between a deeper recessed region, which may help to better protect the die, and a more shallow recessed region, which adds less to the thickness of the integrated circuit package. In the illustrated embodiment, for example, the depth D of the recessed region 116 (i.e., the distance between a top end 122a and a bottom end 122b of the protective structure 112) is approximately between 25 and 150 microns. A depth of at least 1 mil works well for various applications, although depths smaller than 25 microns and greater than 150 microns are also possible.

The exact arrangement of the recessed region 116, the die 102 and the protruding protective structures 112 may vary between different implementations. In the illustrated embodiment, for example, the back surface 108 of the die 102 is generally coplanar with the bottom surface 124 of the recessed region 116. The bottom surface 124 of the recessed region 116 is downset from a surface that is at the top end 122a of the protruding protective structure 112. The base or bottom end 122b of the protective structure 112 is generally coplanar with the bottom surface 124 of the recessed region 116. That is, the recessed region 116 is recessed relative to a bottom surface of the package 100, which is part of the top end 122a of the protective structure 112. One or more protective structures 112 are arranged along and around the periphery of the bottom surface 124 of the recessed region 116. Each protective structure 112 is generally made from the same molding material 106 that is used to encapsulate the die 102 and lead frame 104 and/or is integral with and formed together with the encapsulant. In some designs, however, the protective structure 122 is formed from a different material.

Any suitable lead frame, lead and die arrangement may be used in conjunction with features of the present invention. In the illustrated embodiment, for example, the active surface of the integrated circuit die 102, which is positioned opposite the back surface 108 of the die 102, is directly physically and electrically connected to multiple leads 126. Each lead 126 is connected to the active surface using one or more solder joints 127. In this design, the leads 126 have a gull-wing configuration, extend out of the package and are arranged to electrically connect the die to an external device. In other designs, the leads have different shapes and/or do not extend out of the package. The lead frame may be made of any suitable electrically conductive material, such as copper.

Figure 3A:
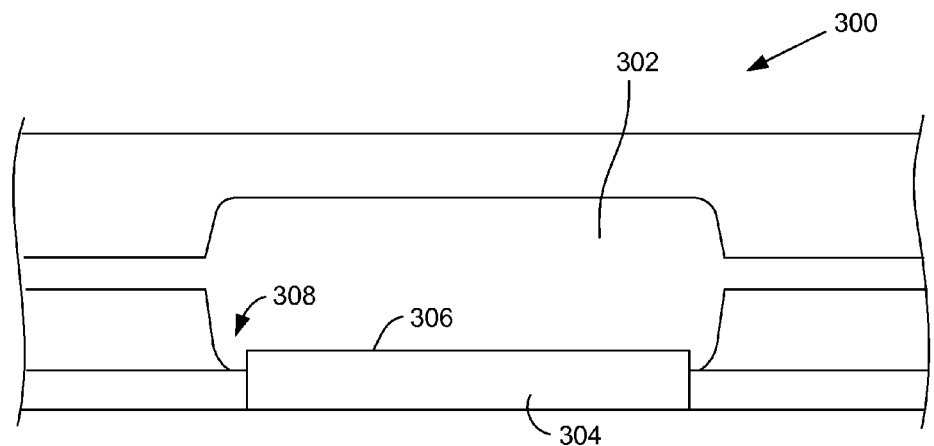
FIGS. 3A-3D are diagrammatic cross-sectional views of various steps in the method illustrated in FIG. 2.

Referring next to FIG. 2 and FIGS. 3A-3C, a method 200 for forming the integrated circuit package 100 illustrated in FIG. 1A according to a particular embodiment of the present invention will be described. Initially, at step 202 a molding apparatus 300 of FIG. 3A is provided. The molding apparatus 300 includes a mold cavity 302 and a support platform 304.

The support platform 304 helps form a bottom surface 306 of the mold cavity 302. There are one or more recessed regions 308 at the periphery of the bottom surface 306 of the mold cavity 302. These regions, which are recessed relative to the bottom surface 306, will be used to later form the protruding protective structure 112 of the integrated circuit package 100 illustrated in FIG. 1.

Figure 3B:
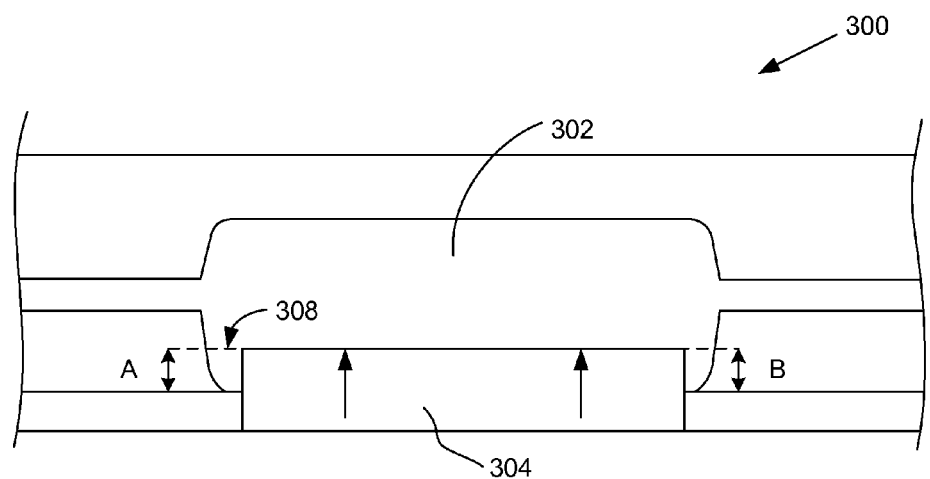

Various implementations involve a support platform 304 that is adjustable and/or can move independently from the rest of the mold cavity 302. That is, the height of the support platform 304 can be raised or lowered to increase or decrease, respectively, the depth of the recessed regions in the mold cavity. This in turn can increase or decrease the height of the protruding protective structures 112 and the depth of the recessed region 116 of the integrated circuit package 100 illustrated in FIG. 1A. Generally, the support platform 304 can be set at multiple different heights to accommodate various package designs. FIG. 3B is a diagrammatic side view of the molding apparatus 300 illustrated in FIG. 3A after the support platform 304 has been raised. Accordingly, the height A of the support platform 304 relative to the bottom of the recessed region 308 has increased and the depth B of the recessed region 308 has likewise increased.

Figure 3C:
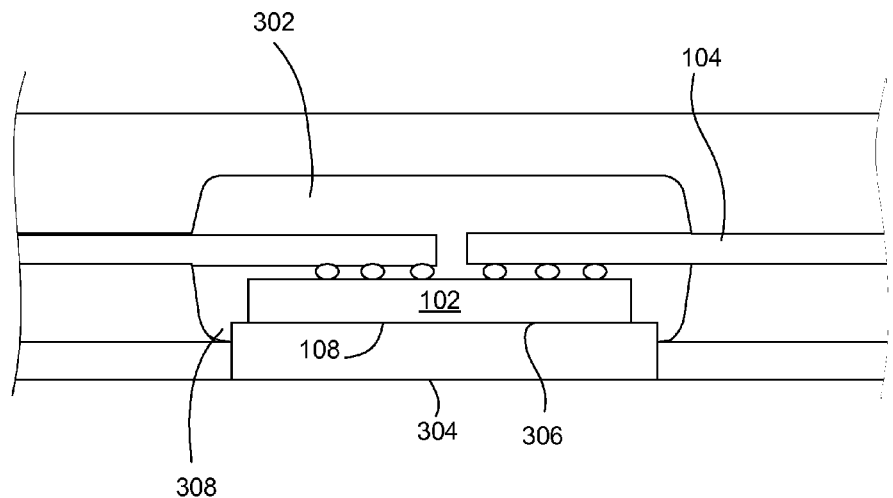

Afterward, an integrated circuit die 102 and an attached lead frame 104 are positioned in the mold cavity 302 (step 204 and FIG. 3C). The back surface 108 of the die 102 is positioned on the support platform 304. Generally, the back surface 108 of the die 102 is pressed or positioned flush against the bottom surface 306 of the mold cavity 302 to help prevent molding material 106 from covering the back surface.

Figure 3D:
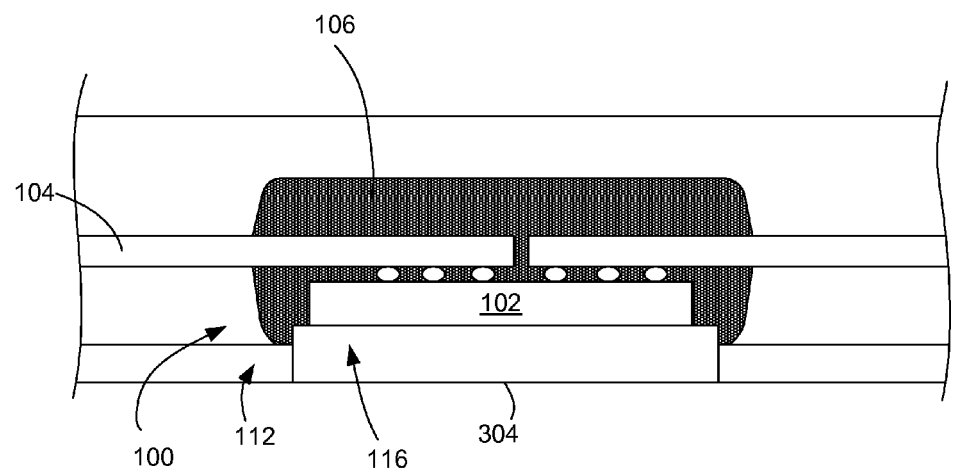

Once the die 102 has been properly positioned and the support platform 304 is set at the desired height, molding material 106 can be injected into the mold cavity 302 (step 206 and FIG. 3D). The molding material 106 at least partially encapsulates the integrated circuit die 102 and the lead frame 104 to form the integrated circuit package 100 illustrated in FIG. 1A. The molding material 106 also fills in the recessed regions 308 at the bottom of the mold cavity 302 to form the protruding protective structures 112 illustrated in FIG. 1A (step 208 of FIG. 2). Since the back surface 108 of the die 102 was positioned against the support platform 304, little or no molding material 106 covers it. The molding process forms a recessed region 116 at a bottom 114 of the integrated circuit package 100, which is where the back surface 108 of the die 102 is situated.

Although FIGS. 3C and 3D illustrate a single die and lead frame, it should be appreciated that the above method may be performed using a lead frame panel with multiple device areas, where each device area supports at least one integrated circuit die 102. That is, FIGS. 3C and 3D may also be understood as illustrating only one device area of multiple device areas on a leadframe panel. The method 200 of FIG. 2 can thus be applied concurrently over each device area to form multiple integrated circuit packages, each with the characteristics of the package 100 illustrated in FIG. 1A. After the packages are formed, the lead frame panel may be singulated to form multiple individual integrated circuit packages.

Although only a few embodiments of the invention have been described in detail, it should be appreciated that the invention may be implemented in many other forms without departing from the spirit or scope of the invention. Therefore, the present embodiments should be considered as illustrative and not restrictive and the invention is not limited to the details given herein, but may be modified within the scope and equivalents of the appended claims.

What is claimed is:

1. An integrated circuit package, having an exposed die and protective housing that extend beyond the back surface of the die, and configured to protect the back surface of the die from damage, the integrated circuit package comprising:
   a lead frame;
   an integrated circuit die that is electrically and physically attached to the lead frame, the back surface of the integrated circuit die being exposed at a bottom of the integrated circuit package;
   a housing that encapsulates the lead frame and the die, the housing including a recessed region at the bottom of the package where the back surface of the die is exposed and a protruding protective structure that is adjacent to the recessed region and that extends away from the recessed region and is configured to prevent the exposed back surface of the die from coming in contact with an external object;
   wherein the protruding protective structure and the recessed region are configured such that when the bottom of the package is placed on a flat surface, the weight of the package falls on the protruding protective structure and the back surface of the die does not come in contact with the flat surface;
   wherein the protruding protective structure is one selected from the group consisting of 1) a wall that extends around the periphery of the recessed region, 2) a foot that is arranged to carry the weight of the integrated circuit package; and 3) a spacer that is arranged to prevent the back surface of the IC die from coming in contact with a surface that is positioned adjacent to the integrated circuit package;
   wherein the protruding protective structure includes a top end and a bottom end, the bottom end being substantially coplanar with the recessed region and the back surface of the die, wherein the recessed region is recessed relative to the top end of the protruding support structure;
   wherein there is a buffer region between the bottom end of the protruding protective structure and an edge of the back surface of the integrated circuit die that is at least 2 mils in length, wherein the buffer region is configured to provide additional space for processing equipment to accurately place the integrated circuit die within the recessed region;
   wherein the depth of the recessed region is approximately between 25 and 150 microns; and
   wherein the protruding protective structure is not overlayed with any conductive material and the protruding protective structure does not include any wires or other conductive material therein.

2. The integrated circuit package as recited in claim 1 wherein the protruding protective structure is the wall and the wall forms a continuous, closed shape around the recessed region.

3. The integrated circuit package as recited in claim 1 wherein the lead frame is copper.

4. The integrated circuit package as recited in claim 1 wherein the lead frame includes a plurality of leads, the integrated circuit die includes an active surface that opposes its back surface, each of the plurality of leads being physically and electrically attached to the active surface of the die with at least one solder joint.

5. The integrated circuit package as recited in claim 1 wherein the bottom of the integrated circuit package has a concave shape, the back surface of the die being positioned at a middle of the concave shape, the edge regions of the concave shape forming the protruding protective structures of the integrated circuit package.

6. The integrated circuit package as recited in claim 1 wherein the housing is formed from molding material and has a bottom surface and the recessed region relative to the bottom surface of the housing and wherein the back surface of the die is exposed at the recessed region and is not coplanar with the bottom surface of the package.

* * * * *